United States Patent [19]

Kim et al.

[11] Patent Number: 5,936,875
[45] Date of Patent: Aug. 10, 1999

[54] INTEGRATED CIRCUIT MEMORY DEVICES INCLUDING OVERLAPPING POWER LINES AND BIT LINES

[75] Inventors: Dae-Yong Kim; Du-Eung Kim; Young-Ho Suh, all of Kyungki-do; Choung-Keun Kwak, Seoul, all of Rep. of Korea

[73] Assignee: Samsung Electronics Co., Ltd., Rep. of Korea

[21] Appl. No.: 08/979,573

[22] Filed: Nov. 26, 1997

[30] Foreign Application Priority Data

Nov. 28, 1996 [KR] Rep. of Korea ............ 96-58957
Oct. 15, 1997 [KR] Rep. of Korea ............ 97-52731

[51] Int. Cl.[6] .................................................. G11C 5/02
[52] U.S. Cl. ...................... 365/51; 365/63; 365/189.08
[58] Field of Search ........................ 365/51, 63, 226, 365/230.03, 189.08

[56] References Cited

U.S. PATENT DOCUMENTS

| | | | |
|---|---|---|---|
| 5,007,025 | 4/1991 | Hwang et al. | 365/226 |
| 5,040,143 | 8/1991 | Matsumura et al. | 365/51 |
| 5,040,144 | 8/1991 | Pelley et al. | 365/51 |
| 5,195,054 | 3/1993 | Noda | 365/635 |
| 5,390,140 | 2/1995 | Tomishima et al. | 365/51 |
| 5,598,363 | 1/1997 | Uchida | 365/63 |
| 5,699,289 | 12/1997 | Takenaka | 365/51 |

Primary Examiner—David Nelms
Assistant Examiner—Hien Nguyen
Attorney, Agent, or Firm—Myers Bigel Sibley & Sajovec

[57] ABSTRACT

Integrated circuit memory devices include overlapping bit lines and power supply lines. The integrated circuit memory devices include a memory cell array in an integrated circuit substrate and a plurality of spaced apart bit lines on the memory cell array, extending in a first direction. A plurality of spaced apart power lines are also included on the memory cell array, extending in the first direction, and on at least one of the plurality of bit lines. The overlapping bit lines and power supply lines are insulated from one another, for example by providing these lines in first and second patterned conductive layers. Accordingly, higher density integrated circuit devices may be provided while allowing high speed operation and effective power supply voltage distribution.

20 Claims, 5 Drawing Sheets

INTEGRATED CIRCUIT MEMORY DEVICES INCLUDING OVERLAPPING POWER LINES AND BIT LINES

FIELD OF THE INVENTION

This invention relates to integrated circuit memory devices, and more particularly to power distribution in integrated circuit memory devices.

BACKGROUND OF THE INVENTION

Integrated circuit memory devices continue to increase in integration density and operational speed, as more and more memory cells are integrated in an integrated circuit. In designing highly integrated memory devices, the power distribution in the integrated circuit can impact the integration density and operational speed. For example, the arrangement of power lines and signal lines in one or two layers can impact the integration density and operating speed. If two layers are used, the layer may occupy a smaller area and have a higher operating speed. Moreover, based on the design of the power lines, the power that is supplied to the interior of the integrated circuit may not be sufficient, thereby impacting performance.

A conventional layout of power lines in an integrated circuit memory device will now be described in connection with FIGS. 1–3. For ease of understanding, FIGS. 1–3 illustrate simplified layouts of a Static Random Access Memory (SRAM) integrated circuit device.

FIG. 1 illustrates an equivalent circuit of a conventional SRAM cell. As shown in FIG. 1, the standard SRAM cell MCI includes high resistance load resistors R1 and R2, conventionally made of polysilicon, and a pair of cross-coupled N-channel MOS transistors Q3 and Q4. A pair of N-channel pass transistors, also referred to as transfer transistors, Q1 and Q2 is also included.

As shown in FIG. 1, the load resistors R1 and R2 are coupled between a power supply voltage and a respective drain of transistors Q3 and Q4, to thereby form nodes N1 and N2. The sources of transistors Q3 and Q4 are coupled to a second power supply voltage, generally ground voltage. The gate of transistor Q3 is cross-coupled to node N2 and the gate of transistor Q4 is cross-coupled to the node N1. First transfer transistor Q1 is coupled between a bit line BL and node N1. The gate of transfer transistor Q1 is coupled to word line WL. Second transfer transistor Q2 is coupled between a complementary bit line $\overline{BL}$ and node N2, with its gate coupled to the word line WL.

As is well known, memory cell MCI stores complementary voltages at nodes N1 and N2. Thus, if the transistors Q1 and Q2 are turned on by an appropriate voltage from word line WL that is supplied by a word line driver coupled to a row decoder, complementary data levels at nodes N1 and N2 are transferred to the bit lines BL and $\overline{BL}$ respectively. This memory cell is also commonly referred to as a four transistor SRAM cell and is widely used in SRAM devices, such as 128K×8 SRAMs.

Referring now to FIG. 2, a layout of transistors Q1–Q4 of FIG. 1 in an integrated circuit will now be described. As shown, the transistor layout is symmetrical with respect to point C and is laid out in an active region 10 of an integrated circuit substrate such as a silicon substrate. Active region 10 is indicated by alternate long and short dashed lines and hatched with oblique lines. As also shown, a gate layer 12 of polysilicon is formed on the active region 10. More specifically, the polysilicon gate layer 12 is divided into four sections that are indicated by dashed lines. The region denoted by reference number 10-N1 in FIG. 2 corresponds to node N1 of FIG. 1. At this region 10-N1 in an active region 10, the drain region Q1d of transistor Q1 and the drain region Q3d of transistor Q3 are formed. As also shown, bit line BL is arranged as a first metal layer on gate layer 12 of transistor Q1. Complementary bit line $\overline{BL}$ is arranged in the first metal layer on gate layer 12 of transistor Q2. The bit lines BL and $\overline{BL}$, indicated by alternating long and short dashed lines, are arranged parallel to each other. The word lines WL are arranged in a second metal layer, on the first metal layer and insulated therefrom. As shown, the word lines WL orthogonally cross the bit lines BL and $\overline{BL}$.

In FIG. 2, an arrangement of power lines that provide power supply and ground voltage to the cell is not indicated. The power lines are not indicated because the power lines generally are arranged in a peripheral region outside the memory cell array region in the integrated circuit. This relationship is shown with reference to FIG. 3.

FIG. 3 illustrates a conventional arrangement of an integrated circuit memory device. As shown in FIG. 1, power lines 100 (ground voltage VSS) and 110 (power supply voltage VCC) are conventionally arranged in the second metal layer outside the memory cell array and at opposite ends thereof. As shown, the memory cell array region includes four memory cell array blocks 303A–303D, each of which includes an array of memory cells, corresponding to FIGS. 1 and 2. A row decoder 302A is arranged between the memory cell array blocks 303A and 303B, and another row decoder is arranged between the memory cell array blocks 303C and 303D. Thus, a row decoder is commonly used by two memory cell array blocks and performs a row decoding operation in response to a row address signal that is received from external to the integrated circuit.

Still referring to FIG. 3, the bit lines BL0–BLn are arranged in the first metal layer on each block of the memory cell array region 303. The bit lines extend parallel to the power lines 100 and 110. Word lines WL0–WLn are arranged in the second metal layer on bit lines BL0–BLn and insulated therefrom. The word lines orthogonally cross the bit lines. A respective word line is coupled to a respective polysilicon gate layer 12 of a memory cell in a strapping region via a contact 301.

In operation, an output of the row decoder 302A is transferred to corresponding memory cells via the word lines and the polysilicon gate layers, through the respective contacts 301. This arrangement can reduce the time delay differences between memory cells that are close to and far away from the row decoder 302.

In the layout of FIG. 3, the bit lines are arranged in a first metal layer and the word lines are arranged in a second metal layer. This double metal layer structure can allow the integrated circuit to have higher operating speeds compared to integrated circuits using a single metal layer. However, there is a need to allow a further decrease in integrated circuit size and allow for an increase in speed.

SUMMARY OF THE INVENTION

It is therefore an object of the present invention to provide improved arrangements for integrated circuit memory devices.

It is another object of the present invention to provide improved power line distribution arrangements for integrated circuit devices, that can allow higher integration density and/or improved operational speed.

These and other objects are provided, according to the present invention, by integrated circuit memory devices that include overlapping bit lines and power supply lines. The integrated circuit memory devices include a memory cell array in an integrated circuit substrate and a plurality of spaced apart bit lines on the memory cell array, extending in a first direction. A plurality of spaced apart power lines are also included on the memory cell array, extending in the first direction, and on at least one of the plurality of bit lines. The overlapping bit lines and power supply lines are insulated from one another, for example by providing these lines in first and second patterned conductive layers. Accordingly, higher density integrated circuit devices may be provided while allowing high speed operation and effective power supply voltage distribution.

An embodiment of integrated circuit memory devices according to the invention includes a memory cell array in an integrated circuit substrate. The memory cell array includes a plurality of rows and a plurality of columns of memory cells that define a row direction and a column direction. A pair of memory cell array edges are located at opposing ends of the memory cell array, extending in the column direction. A plurality of spaced apart bit lines are included on the memory cell array, between the pair of memory cell array edges and extending in the column direction. A plurality of spaced apart power lines are also included on the memory cell array, between the pair of memory cell array edges, and extending in the column direction. The plurality of spaced apart power lines overlap with and are insulated from at least one of the plurality of bit lines. A plurality of spaced apart word lines are also included on the memory cell array, extending in the row direction and insulated from the plurality of spaced apart bit lines and spaced apart power lines.

Preferably, the integrated circuit memory devices include first and second spaced apart patterned conductive layers on an integrated circuit substrate. The plurality of spaced apart bit lines are included in the first patterned conductive layer and the plurality of spaced apart power lines and spaced apart word lines are included in the second patterned conductive layer. The plurality of spaced apart word lines in the second patterned conductive layer do not contact the spaced apart power lines in the second patterned conductive layer by allowing each of the spaced apart word lines to extend in the row direction to a word line end adjacent but not touching the spaced apart power lines. Each of the spaced apart word lines includes a word line contact at the word line end adjacent the spaced apart power line. A plurality of spaced apart polysilicon gate lines is also included, a respective one of which is connected to a respective word line contact and extends in the row direction in overlapping relationship with the plurality of spaced apart power lines. Thus, the word lines need not extend fully to the memory cell array edges, and the spaced apart power lines may be included in the space that would otherwise be occupied by the ends of the word lines.

The plurality of spaced apart power lines may include a power supply voltage line and a ground line. However, multiple power supply voltages and multiple ground lines may also be provided. The memory cell may be four transistor SRAM cell or another conventional memory cell. A plurality of row decoders may also be included, that are coupled to the plurality of spaced apart word lines. Finally, the first and second patterned conductive layers are preferably first and second patterned metal layers. Accordingly, a compact layout of an integrated circuit memory device may be provided with efficient power distribution.

DETAILED DESCRIPTION OF PREFERRED EMBODIMENTS

Figure 1:
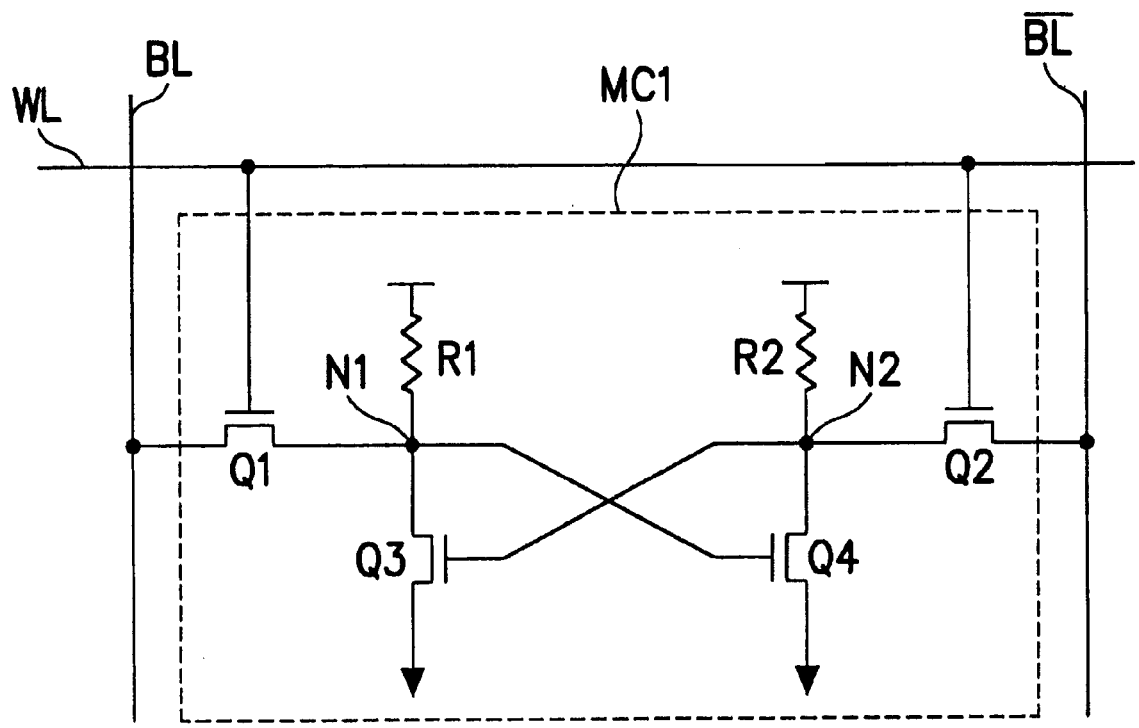
FIG. 1 is a circuit diagram of a conventional memory cell of an SRAM.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 4:
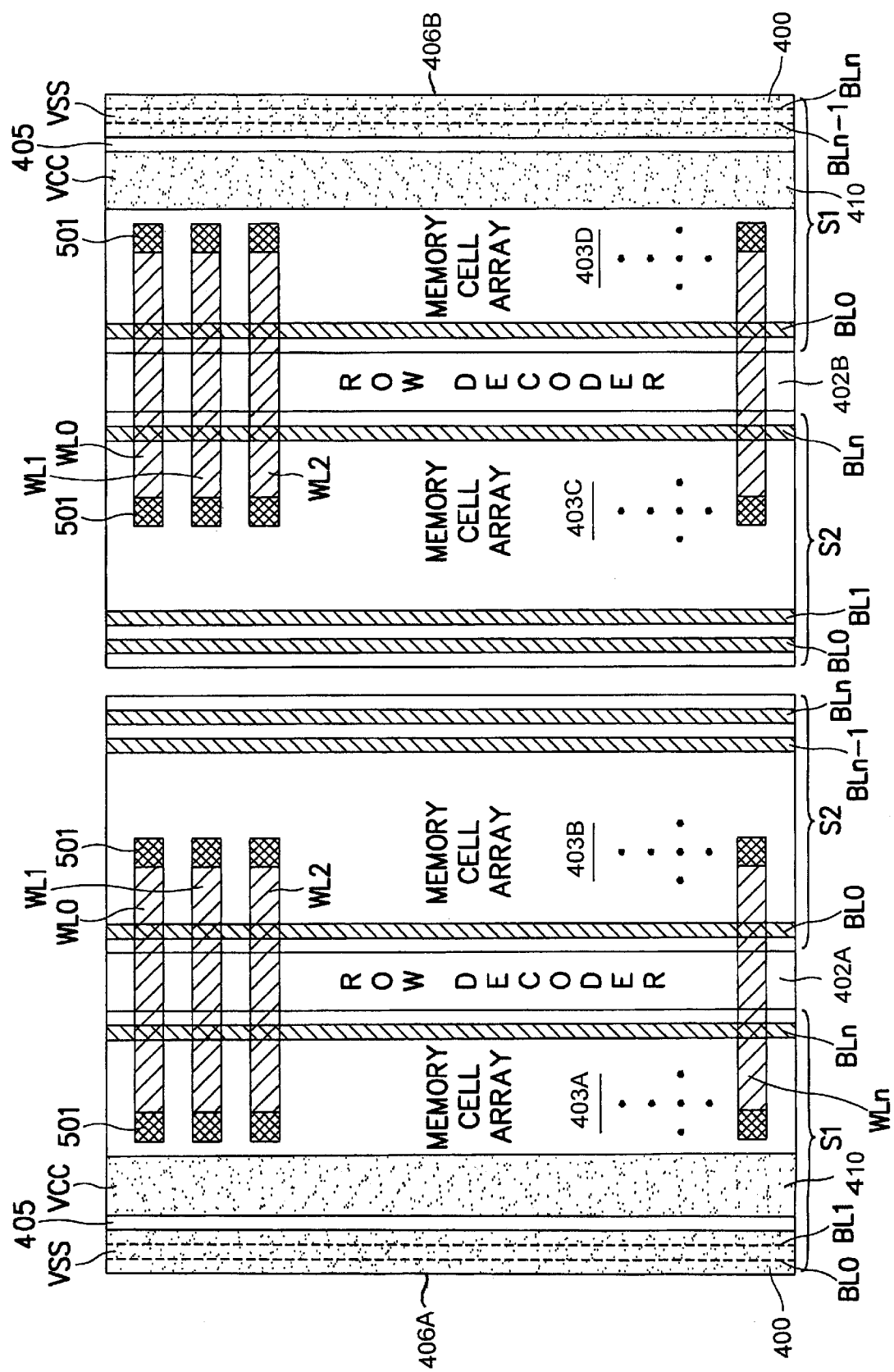
FIG. 4 is a simplified top view of integrated circuit memory devices according to the present invention.

Referring now to FIG. 4, a simplified top view of integrated circuit memory devices according to the invention is shown. As shown in FIG. 4, an integrated circuit memory device includes a plurality of memory cell arrays 403A–403D in an integrated circuit substrate. The memory cell array includes a plurality of horizontal rows and a plurality of vertical columns of memory cells that define a horizontal row direction and a vertical column direction. A pair of memory cell edges 406A, 406B are thereby defined on opposing ends of the memory cell array, extending in the column direction. It will be understood that the terms "row" and "column" are used to indicate a first and second direction and do not define any particular horizontal, vertical or orthogonal orientation. However, for the sake of clarity, these directions will continue to be referred to as the row direction and the column direction.

Still referring to FIG. 4, a plurality of spaced apart bit lines BL0–BLn are provided on the memory cell array, between the memory cell array edges 406A, 406B, extending in the column direction. A plurality of spaced apart power lines 400, 410 are also provided on the memory cell array, between the pair of memory cell array edges 406A, 406B, extending in the column direction. The plurality of spaced apart power lines overlap with and are insulated from at least one of the bit lines. For example, as shown in FIG. 4, the left hand power line 400 overlaps with bit lines BL0 and BL1, and the right hand power line 400 overlaps with bit lines BLn-1 and BLn. Similarly, although not shown, the second power supply lines 410 also overlap with at least one bit line.

Figure 3:
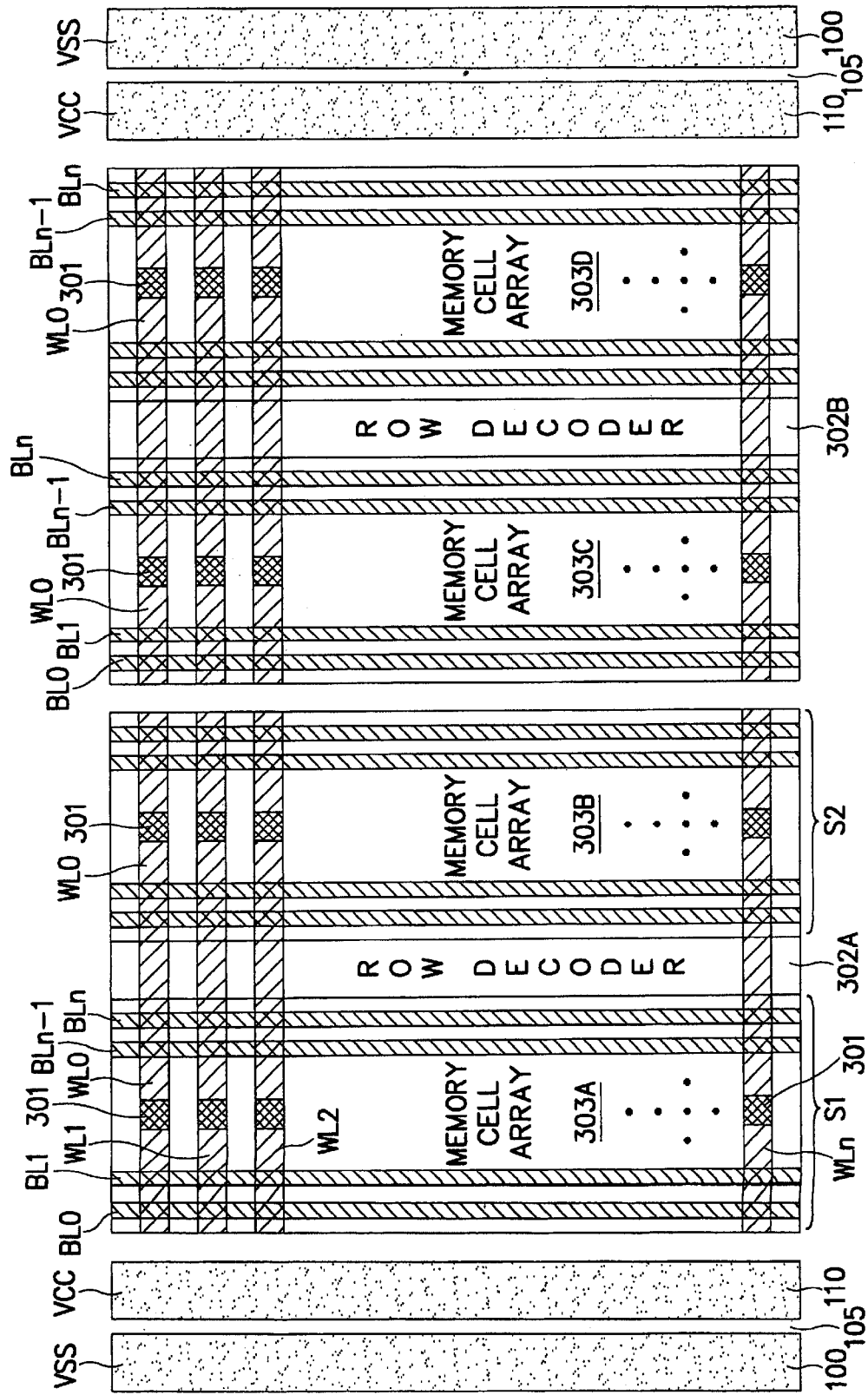
FIG. 3 is a simplified top view of a conventional integrated circuit memory device.

Accordingly, in contrast with the arrangement of FIG. 3, the power distribution lines are included on the memory cell array rather being restricted to a peripheral portion of the integrated circuit memory device outside the memory cell array. Compact designs may thereby be provided.

Accordingly, the memory cell array region includes memory cell array blocks 403A–403D that define memory array edges 406A–406B. The power lines 400 and 410 that respectively transfer ground voltage VSS and power supply voltage VCC are arranged on the memory cell array over the memory cells and between the edges 406A–406B. It will be understood that the power lines 100 and 110 may also function as power lines for input/output or power lines for a peripheral circuit. Additional power lines outside the memory cell array may also be included.

The VSS power line 400 and the VCC power line 410 are electrically isolated from each other and are preferably included in the same metal layer, extending in parallel to each other. Row decoders 402A and 402B are shared between memory cell arrays, as was already described for FIG. 3.

Bit lines BL0–BLn are arranged in parallel to one another in the column direction. They are preferably formed in a first metal layer on the memory cell array region, between the memory cell array edges 406A–406B. An insulating layer such as an oxide film is provided between the memory cell array and the bit lines.

The word lines WL0–WLn in FIG. 4 are shorter than the word lines in FIG. 3. In particular, since word lines WL0–WLn of FIG. 4 are part of the second metal layer which also includes the power lines 400 and 410, the word lines are made shorter so that they do not contact the power lines. It will be understood that an insulating layer such as an oxide film is generally provided between the second metal layer and the first metal layer.

At least some of the bit lines BL0–BLn overlap the power lines 400, 410. Thus, power lines 100 and 110 are included in the array area, but are electrically isolated from the word lines and the bit lines. The bit lines are arranged in the first metal layer, and the word lines and power lines are arranged in the second metal layer.

In order to couple all of the memory cells to the word lines WL1–WLn, a polysilicon gate line is used. More specifically, since the word lines WL1–WLn preferably do not extend across the entire row of memory cells, polysilicon gate lines are used to couple the word line to the entire row of memory cells in the array. The use of a polysilicon gate line will be described in detail in connection with FIG. 5.

Figure 2:
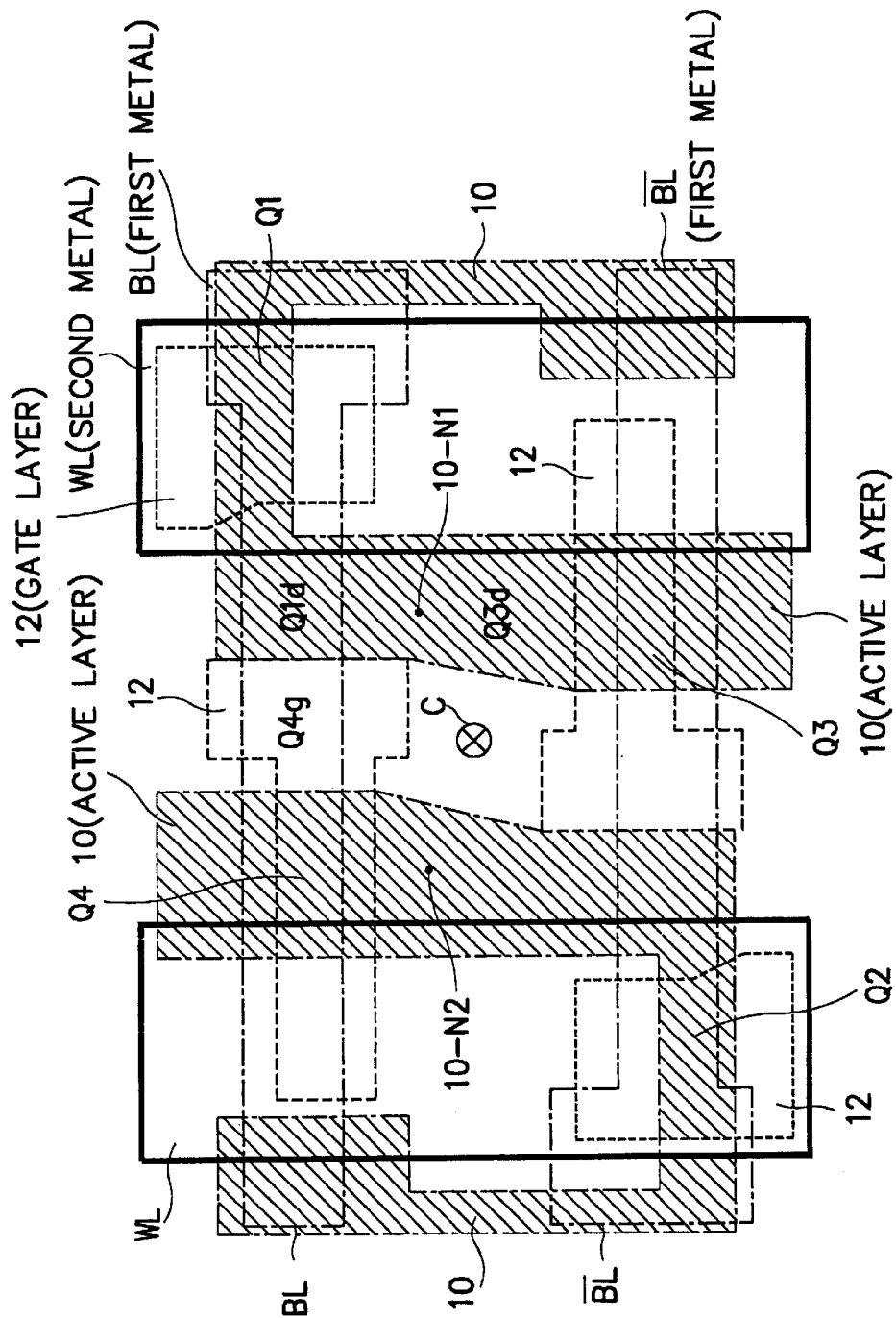
FIG. 2 is a top view of a layout of a memory cell of FIG. 1 in an integrated circuit.
Figure 5:
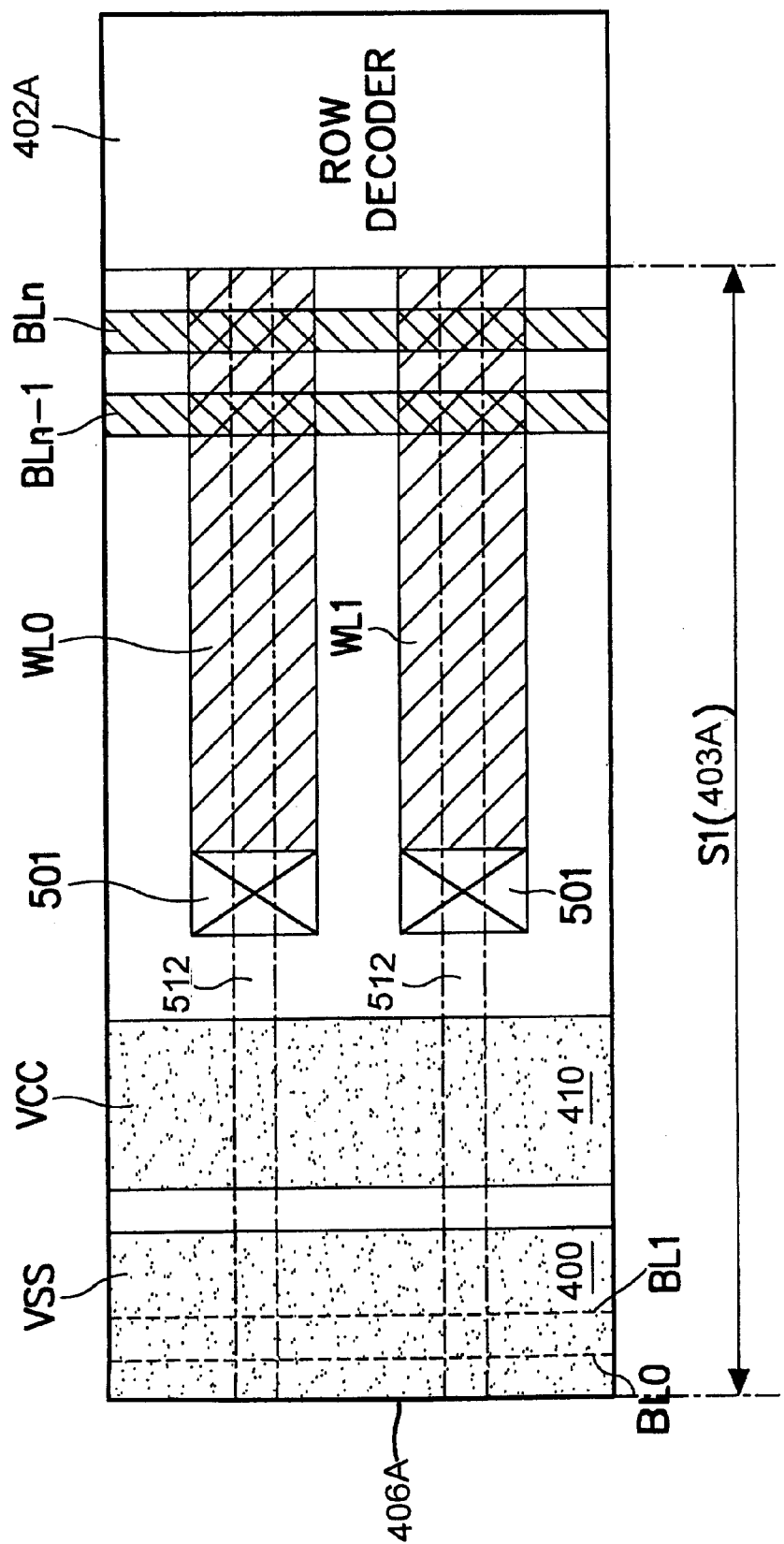
FIG. 5 is an enlarged diagram of FIG. 4 illustrating portions of the power lines and word lines.

As shown in FIG. 5, polysilicon gate line layers 512 extend parallel to each other in the row direction from an edge of the row decoder 402A to the edge of the memory cell 406A. It will be understood by those having skill in the art, that although the polysilicon gate layer 512 is indicated by a straight long and short dashed line, it is substantially formed at the upper portion of the gate layer 12 through insulating layer as shown in FIG. 2. Polysilicon gate layer 512 is positioned under the bit lines BL0–BLn and may be a polycide layer made by reacting polysilicon or reacting refractory metal with polysilicon.

Thus, the polysilicon gate layer 512 reaches all of the memory cells, even though the word lines do not extend to all of the memory cells. A contact 501 formed in the strapping region of the word lines is used to contact the word line to the polysilicon gate line. The contact 501 may also connect to a resistor. Contact 512 may be placed at a two-thirds point of the memory cell array block S1 (403A) from the edge of the row decoder 402A. The "two-thirds" calculation is based on an assumption that a word line is connected to 256 memory cells. In this case, the power lines 400 and 410 are formed on one-third of the memory cell array block 403A and 403D. It will also be understood that signal lines may also be formed in this area.

Accordingly, since the bit lines are arranged as part of a first metal layer, and the word lines and power lines are arranged as part of a second metal layer, integrated circuit memory devices according to the invention may have higher operating speeds compared with integrated circuit memory devices using a single metal layer. Moreover, since the power lines are arranged on the memory cell array region of the integrated circuit as part of the second metal layer, it is possible to provide more memory cells or to reduce the integrated circuit size. Moreover, excellent power distribution may be provided in the integrated circuit device, thereby enhancing reliability and/or operational speed.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device comprising:
   a memory cell array in an integrated circuit substrate, the memory cell array including a plurality of rows and a plurality of columns of memory cells that define a row direction and a column direction and a pair of memory cell array edges on opposing ends of the memory cell array extending in the column direction;
   a plurality of spaced apart bit lines on the memory cell array, between the pair of memory cell array edges, extending in the column direction; and
   a plurality of spaced apart power lines that are separate from the plurality of spaced apart bit lines on the memory cell array, between the pair of memory cell array edges, extending in the column direction, the plurality of spaced apart power lines that are separate from the plurality of spaced apart bit lines overlapping with and being insulated from at least one of the plurality of bit lines.

2. An integrated circuit memory device according to claim 1 further comprising:
   a plurality of spaced apart word lines on the memory cell array, extending in the row direction and insulated from the plurality of spaced apart bit lines and spaced apart power lines.

3. An integrated circuit memory device according to claim 1 further comprising first and second spaced apart patterned conductive layers on the integrated circuit substrate, wherein the plurality of spaced apart bit lines are included in the first patterned conductive layer and wherein the plurality of spaced apart power lines are included in the second patterned conductive layer.

4. An integrated circuit memory device according to claim 2 further comprising first and second spaced apart patterned conductive layers on the integrated circuit substrate, wherein the plurality of spaced apart bit lines are included in the first patterned conductive layer and wherein the spaced apart power lines and the spaced apart word lines are included in the second patterned conductive layer.

5. An integrated circuit memory device according to claim 1 wherein the plurality of spaced apart power lines comprise a power supply voltage line and a ground line.

6. An integrated circuit memory device according to claim 4 wherein each of the spaced apart word lines extends in the row direction to a word line end adjacent the spaced apart power lines, each of the spaced apart word lines further comprising:
   a word line contact at the word line end adjacent the spaced apart power lines.

7. An integrated circuit memory device according to claim 1 wherein each memory cell is a Static Random Access Memory (SRAM) cell including four transistors.

8. An integrated circuit memory device according to claim 6 further comprising a plurality of spaced apart polysilicon gate lines, a respective one of which is connected to a respective word line contact and extends in the row direction in overlapping relationship with the plurality of spaced apart power lines.

9. An integrated circuit memory device according to claim 2 further comprising a plurality of row decoders that are coupled to the plurality of spaced apart word lines.

10. An integrated circuit memory device according to claim 3 wherein the first and second patterned conductive layers are first and second patterned metal layers.

11. An integrated circuit memory device comprising:

a memory cell array in an integrated circuit substrate;

a plurality of spaced apart bit lines on the memory cell array, extending in a first direction; and a plurality of spaced apart power lines that are separate from the plurality of spaced apart bit lines on the memory cell array, extending in the first direction, and on at least one of the plurality of bit lines that are separate from the plurality of spaced apart power lines.

12. An integrated circuit memory device according to claim 11 further comprising:

a plurality of spaced apart word lines on the memory cell array, extending in a second direction.

13. An integrated circuit memory device according to claim 11 further comprising first and second spaced apart patterned conductive layers on the integrated circuit substrate, wherein the plurality of spaced apart bit lines are included in the first patterned conductive layer and wherein the plurality of spaced apart power lines are included in the second patterned conductive layer.

14. An integrated circuit memory device according to claim 12 further comprising first and second spaced apart patterned conductive layers on the integrated circuit substrate, wherein the plurality of spaced apart bit lines are included in the first patterned conductive layer and wherein the spaced apart power lines and the spaced apart word lines are included in the second patterned conductive layer.

15. An integrated circuit memory device according to claim 11 wherein the plurality of spaced apart power lines comprise a power supply voltage line and a ground line.

16. An integrated circuit memory device according to claim 14 wherein each of the spaced apart word lines extends in the second direction to a word line end adjacent the spaced apart power lines, each of the spaced apart word lines further comprising:

a word line contact at the word line end adjacent the spaced apart power lines.

17. An integrated circuit memory device according to claim 11 wherein the memory cell array is an array of Static Random Access Memory (SRAM) cells, each including four transistors.

18. An integrated circuit memory device according to claim 16 further comprising a plurality of spaced apart polysilicon gate lines, a respective one of which is connected to a respective word line contact and extends in the second direction in overlapping relationship with the plurality of spaced apart power lines.

19. An integrated circuit memory device according to claim 12 further comprising a plurality of decoders that are coupled to the plurality of spaced apart word lines.

20. An integrated circuit memory device according to claim 13 wherein the first and second patterned conductive layers are first and second patterned metal layers.

* * * * *